(12) United States Patent
Olson

(10) Patent No.: US 6,447,843 B1
(45) Date of Patent: Sep. 10, 2002

(54) SYNTHETIC DIAMOND WEAR COMPONENT AND METHOD

(75) Inventor: James M. Olson, Londonderry, NH (US)

(73) Assignee: Saint-Gobain Industrial Ceramics, Inc., Worcester, MA (US)

( * ) Notice: Subject to any disclaimer, the term of this patent is extended or adjusted under 35 U.S.C. 154(b) by 676 days.

(21) Appl. No.: 08/826,209

(22) Filed: Mar. 27, 1997

(51) Int. Cl.⁷ .............................................. C23C 16/26

(52) U.S. Cl. .................. 427/249.8; 427/255.7

(58) Field of Search .............................. 427/249, 255.7, 427/577, 249.8; 423/449; 51/309; 407/119

(56) References Cited

U.S. PATENT DOCUMENTS

| | | |
|---|---|---|
| 4,471,003 A | 9/1984 | Cann |
| 4,487,162 A | 12/1984 | Cann |
| 4,900,628 A | 2/1990 | Ikegaya et al. |
| 5,135,807 A | 8/1992 | Ito et al. |
| 5,204,144 A | 4/1993 | Cann et al. |
| 5,240,749 A | 8/1993 | Chow |

(List continued on next page.)

FOREIGN PATENT DOCUMENTS

| | | | |
|---|---|---|---|
| EP | 0567142 A2 | 10/1993 | .......... A61M/39/00 |
| EP | 699776 A1 | 3/1996 | |
| JP | 05-023903 | * 2/1993 | |
| JP | 05-057508 | * 3/1993 | |

OTHER PUBLICATIONS

Diamond Related Materials, vol. 2, No. 2 / 04, Mar. 31, 1993, pp. 158–168, XP000361165 Wild C. et al: "Chemical Vapour Deposition and Characterization of Smooth {100}–Faceted Diamond Films".

Applied Physics Letters, vol. 68, No. 14, Apr. 1, 1996, pp. 1927–1929, XP000585110 Jiang X et al: "Diamond Film Orientation By Ion Bombardment During Deposition" *p. 1928, right–hand column, Line 1–Line 26*.

P.C. Yang, J.T. Glass and W. Zhu, "Nucleation of Oriented Diamond Film on Nickel Substrates", J. Mater. Res. 8, (8), 1773–1776. Aug. 1993.

W. Zhu, P.C. Yang and J.T. Glass: "Oriented Diamond Films Grown on Nickel Substrates", Appl. Phys. Lett., 63, (12), 20, 1640–1642. Sep. 1993.

P.C. Yang, W. Zhu and J.T. Glass: "Deposition of Diamond Films on Nickel Substrates by Hot Filament Chemical Vapor Deposition", Electrochemical Society Conference Proceedings, Honolulu, Hawaii, May 1993.

Koidl et al., "Structure And Morphology Of Oriented Diamond Films", Proc. NIRIM Int. Symp. Adv. Mat., Tsukuba (Japan), Mar. 13, 1994.

Wild et al., "Chemical Vapor Deposition And Characterization Of Smooth {100}–Faceted Diamond Films", Diamond And Related Materials, 2, 158–168, 1993.

Clausing et al., "Textures And Morphologies Of Chemical Vapor Deposited (CVD) Diamond", Diamond And Related Materials, 1, 411–415, 1992.

Kohl et al., "Oriented Nucleation And Growth Of Diamond Films On β–SiC and Si", Appl. Phys. Lett. 63 (13) Sep., 1993.

*Primary Examiner*—Bret Chen
(74) *Attorney, Agent, or Firm*—Martin M. Novack; Volker R. Ulbrich; Alexander H. Plache

(57) ABSTRACT

A method is set forth for making a diamond film coated wear part, including the following steps: providing a part; depositing a first layer of polycrystalline diamond film on the part with non-{100} crystallographic faceting; and depositing on the first layer a second layer of polycrystalline diamond film having {100} crystallographic faceting, the second layer having a thickness sufficient to overgrow the roughness of said surface of said first layer with a continuous film.

12 Claims, 5 Drawing Sheets

U.S. PATENT DOCUMENTS

| | | |
|---|---|---|
| 5,314,652 A | 5/1994 | Simpson et al. |
| 5,380,349 A * | 1/1995 | Taniguchi et al. ............ 65/286 |
| 5,514,242 A | 5/1996 | Simpson |
| 5,525,815 A | 6/1996 | Einset |
| 5,529,846 A | 6/1996 | Hayashi et al. |

* cited by examiner

SYNTHETIC DIAMOND WEAR COMPONENT AND METHOD

FIELD OF THE INVENTION

This invention relates to improvements in wear components having synthetic diamond wear surfaces and, more particularly, to improved diamond-coated wear components and to a method of making such diamond coated wear components.

BACKGROUND OF THE INVENTION

The use of natural diamond in wear components, such as in cutting and grinding tools, is quite old. In addition to extreme hardness, diamond's superlative thermal conductivity, thermal stability, and inertness are unsurpassed for wear applications. In recent times synthetic polycrystalline diamond films have been successfully produced, such as by chemical vapor deposition (CVD), and used commercially in wear applications. The synthetic diamond films can be deposited directly on the base of a wear component as a film. For example, a cutting tool with a hard face or insert formed of tungsten carbide or of a ceramic, such as silicon nitride, can be coated with a thin film of synthetic diamond. Alternatively, the diamond can be produced separately, for example as a thick film, and mounted on the base of a wear component, such as by brazing.

After a diamond film has been deposited for use as a wear surface, it is generally necessary to polish the diamond coating in order to obtain a low friction surface. However the same hardness which makes diamond ideal for cutting tools, renders it difficult to polish. Polishing can be achieved with diamond abrasive, but it is expensive. It is among the objects of the present invention to provide diamond film for cutting tools which addresses and solves the problem caused by the difficulty of polishing diamond film cutting surfaces.

SUMMARY OF THE INVENTION

The present invention uses a layered diamond film structure, for cutting tool application and other wear applications, which reduces or eliminates the need for polishing the diamond surface after deposition of the diamond film.

The growth of {110} and {111} crystallographic orientation diamond films, which are the surface textures typically obtained when diamond film is produced by CVD, usually results in a film having a high profile, rough surface. As the diamond film thickness increases, the roughness generally increases for diamond films terminated by these textures since the films grow in a columnar fashion and the grain size of the growth surface increases with film thickness.

It is known that {100} orientation diamond film tends to have its facets parallel to the substrate on which it is deposited, thereby resulting in a relatively smooth surface. It has been shown that for {100} textured diamond films, although grain size does scale with film thickness, surface roughness does not. [See Koidl et al., "Structure And Morphology Of Oriented Diamond Films", Proc. NIRIM Int. Symp. Adv. Mat., Tsukuba (Japan), Mar. 13, 1994; Wild et al., "Chemical Vapor Deposition And Characterization Of Smooth {100}-Faceted Diamond Films", Diamond And Related Materials, 2, 158–168, 1993; Clausing et al., "Textures And Morphologies Of Chemical Vapor Deposited (CVD) Diamond", Diamond And Related Materials, 1, 411–415, 1992; Kohl et al., "Oriented Nucleation And Growth Of Diamond Films On β-SiC and Si", Appl. Phys. Lett. 63 (13) September, 1993.] Since {100} orientation diamond has coplanar facets generally parallel to the substrate surface, the result is known to be a relatively smooth surface, even without polishing. However, the {100} orientation diamond has the least wear resistance as bulk material of the various diamond crystallographic orientations.

In the present invention, the smooth surface characteristic of {100} orientation diamond is used to advantage, without the accompanying low wear resistance property, by depositing a different orientation diamond [for example, without limitation, {110} or {111} orientation] for most of the total film thickness, and then depositing an exceedingly thin top layer of {100} orientation diamond. Preferably, the surface layer will have the minimum thickness required to overgrow the rough underlayer and provide a smooth free-surface of the diamond film. The thickness of the {100} faceted top layer required is therefore dependent on the roughness of the underlying film. The resultant diamond film structure has the attribute of toughness resulting from the non-{100} faceted material used for the bulk of the film, and the attribute of surface smoothness resulting from the {100} faceted material on the surface.

In accordance with an embodiment of the invention, a method is set forth for making a diamond film coated wear part, comprising the following steps: providing a part; depositing a first layer of polycrystalline diamond film on the part with non-{100} crystallographic faceting; depositing on the first layer a second layer of polycrystalline diamond film having {100} crystallographic faceting, the second layer having a thickness sufficient to overgrow the roughness of said surface of said first layer with a continuous film. While the thickness of the first layer is dependent on nucleation density, in practice it may be of the order of 0.5 to 10 $\mu$m. The second layer of polycrystalline diamond film having a {100} texture at the free surface has thickness in the range of 0.5 to 25 $\mu$m. The thickness is dependent on the application. Cutting tools used for machining metals for example would require a film with a total thickness on the order of 15–45 $\mu$m while other wear parts such as a pump seal or bearing surface may require a film with a thickness on the order of 1–10 $\mu$m.

In a form of the invention, the second layer is deposited using biased nucleation chemical vapor deposition to obtain diamond film having {100} crystallographic orientation the biased nucleation can comprise applying a silica powder impurity on the first layer before deposition of the second layer. Alternatively, the second layer of diamond film can be deposited by chemical vapor deposition using a set of deposition conditions that is different than the set of deposition conditions that were used to deposit the first layer.

Further features and advantages of the invention will become more readily apparent from the following detailed description when taken in conjunction with the accompanying drawings.

DETAILED DESCRIPTION

Figure 1:
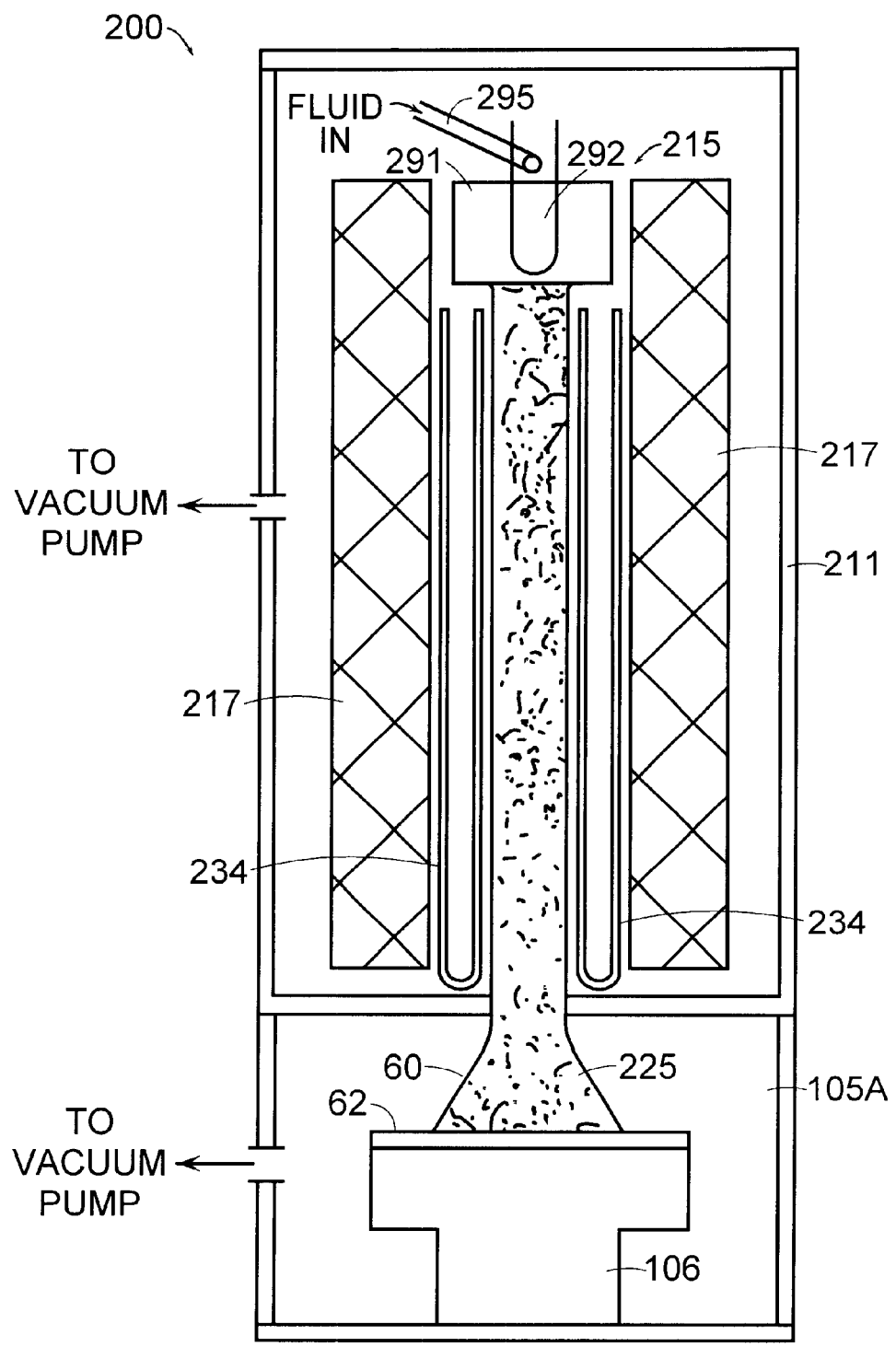
FIG. 1 is a schematic diagram of a CVD plasma jet deposition system of a type which can be utilized in practicing an embodiment of the invention.

Referring to FIG. 1, there is shown a diagram of a chemical vapor deposition (CVD) plasma jet deposition system 200 of a type which can be utilized in practicing an embodiment of the invention. The system 200 is contained within a housing 211 and includes an arc-forming section 215 which comprises a cylindrical cathode holder 294, a rod-like cathode 292, and an injector 295 mounted adjacent the cathode so as to permit injected fluid to pass over the cathode 292. A cylindrical anode is represented at 291. In the illustrated system the input fluid may be a mixture of hydrogen and methane. The anode 291 and cathode 292 are energized by a source of electric potential (not shown), for example a DC potential. Cylindrical magnets, designated by reference numeral 217, are utilized to control the plasma generated at the arc forming section. The magnets maintain the plasma within a narrow column until the plasma reaches the deposition region 60. Optional cooling coils 234, in which a coolant can be circulated, can be located within the magnets.

In operation, a mixture of hydrogen and methane is fed to the injector 295, and a plasma is obtained in front of the arc forming section and accelerated and focused toward the deposition region. The temperature and pressure at the plasma formation region are typically in the approximate ranges 1500–15,000 degrees C and 100–700 torr, respectively, and in the deposition region are in the approximate ranges 800–1100 degrees C and 0.1–200 torr, respectively. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. No. s 4,471,003, 4,487,162, and 5,204,144.

The bottom portion 105A of the chamber has a base 106 on which can be mounted a substrate 10 on which the synthetic diamond is to be deposited. If desired, the substrate can be a tool surface or tool insert on which diamond film is to be deposited. The base can include a temperature controller. The substrate may be, for example, molybdenum, tungsten, or graphite, with molybdenum (and its alloys such as TZM, which contains relatively small percentages of titanium and zirconium) being presently preferred. Reference can be made, for example, to U.S. Pat. No. 5,314,652, assigned to the same assignee as the present Application, which describes considerations of roughness of the substrate with regard to appropriate holding and release of the diamond during and after deposition, and also describes the advantageous use of an interlayer (e.g. illustrated at 30 in FIG. 2), such as a titanium nitride interlayer, for coating the substrate on which the synthetic diamond is to be deposited and ultimately released.

Figure 2:
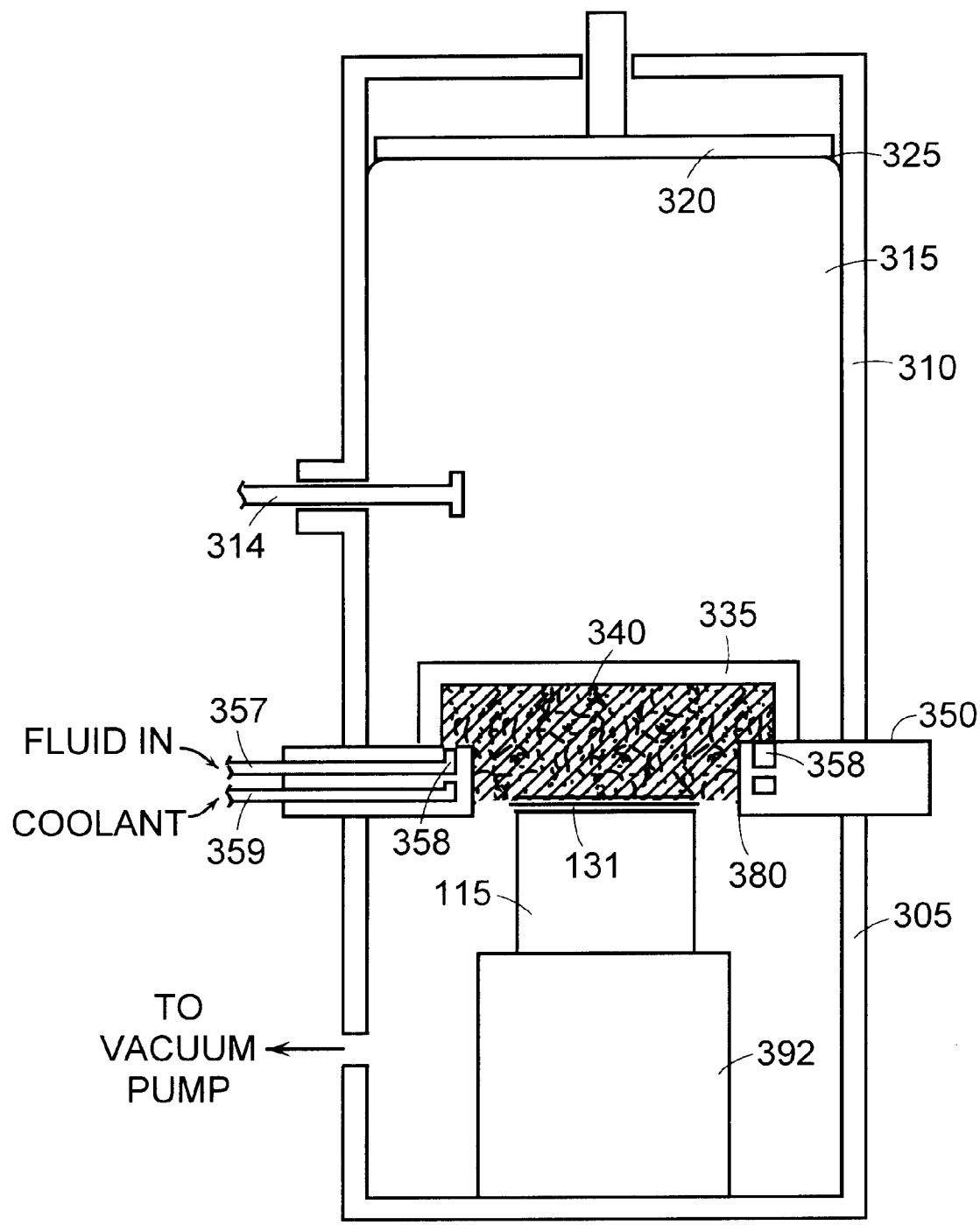
FIG. 2 is a schematic diagram of a CVD microwave plasma deposition system of a type which can be utilized in practicing an embodiment of the invention.

The invention can also be practiced using other deposition equipment, for example a microwave plasma CVD equipment of the type illustrated in FIG. 2. A metal container 310 defines the walls of a microwave cavity 315, the top of which can be a plate 320, with finger stock 325, that serves as an adjustable sliding short. An excitation probe 314 is provided, and its position within the cavity can be made adjustable. A quartz bell jar 335, which is used to contain a plasma 340, is mounted on a ringshaped base 350 to which a vacuum chamber 305 and the microwave cavity 310 are attached. A gas injector 357 is used to feed a hydrocarbon gas (e.g. methane) and hydrogen mix into the plasma forming region through apertures indicated at 358. A cooling line 359 can be used to circulate a coolant to cool the base, or cooling coils (not shown) can be provided. A mounting insert 115, with a substrate 131 thereon (which, if desired, can be a tool surface or a tool insert), is positioned on a support 392, and a disc-shaped metal grid 380 can be used to define part of the bottom of the microwave cavity, as shown. In operation, as the mixture of hydrogen and hydrocarbon gas is fed in, microwave energy in the cavity 315 creates the plasma 340, and polycrystalline diamond will be deposited on the surface of substrate 131. In a microwave plasma apparatus it is generally beneficial to control temperature at the substrate, and this may be implemented by any suitable known means, for example a heat exchanger. Also, if desired, an apertured BN plate and/or cover can be used on the insert (or on the entire holder) to protect edges from overheating in the microwave field.

Figure 3:
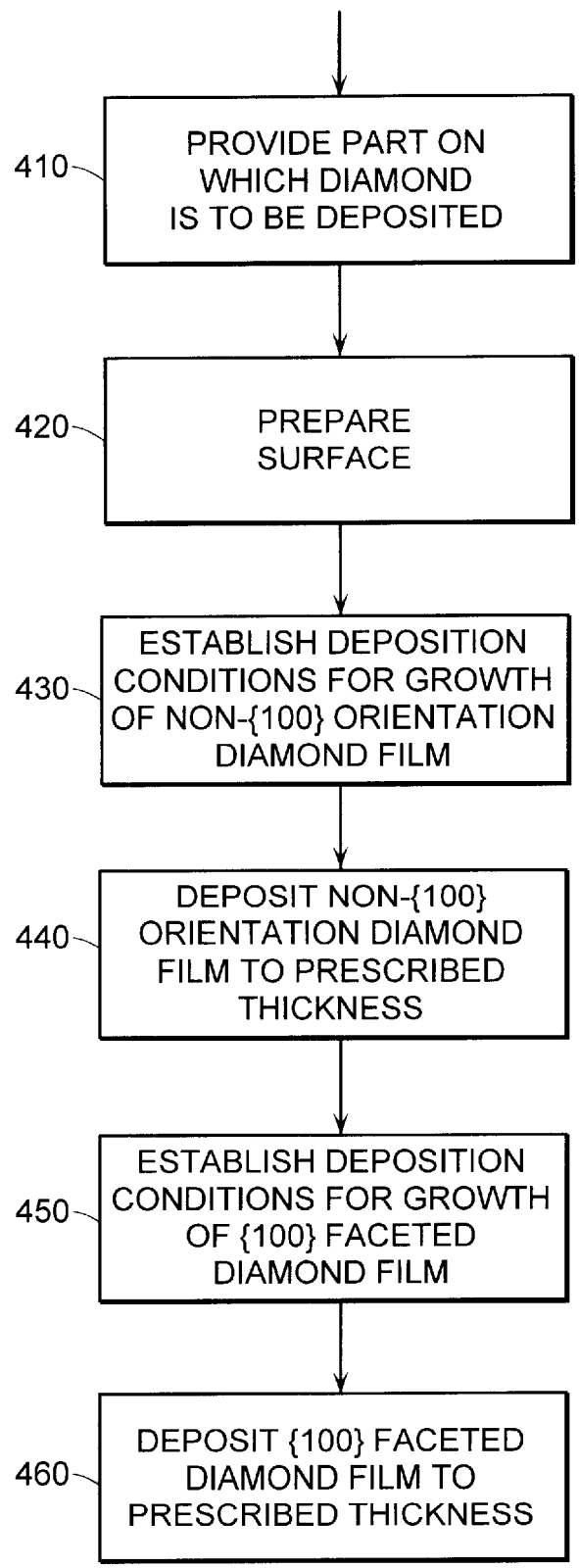
FIG. 3 is an operational flow diagram of a procedure in accordance with an embodiment of the invention for producing a synthetic diamond coated wear part.

Referring to FIG. 3, there is shown a flow diagram representative of a procedure in accordance with an embodiment of the invention. The block 410 represents providing of the part, such as the tool surface or tool insert on which a synthetic polycrystalline diamond surface is to be applied. The block 420, which is optional, represents preparation of the surface of the tool or the insert for the diamond deposition. As one example, if the insert is comprised of $Si_3N_4$, the surface can be prepared by ultrasonic seeding using a suspension of diamond powder in alcohol. The block 430 represents establishing the deposition conditions for depositing polycrystalline diamond which does not have a {100} crystallographic orientation; that is, for example, {110} or {111} diamond that will have a relatively good wear characteristic. This is described further below. The block 440 represents depositing the non-{100} diamond film to a thickness of at least 10 microns. Then, the block 450 represents establishing deposition conditions for depositing polycrystalline diamond having {100} crystallographic faceting. The {100} faceted film is deposited to a prescribed thickness, as represented by the block 460. The thickness is application dependent but may be in the range 10 to 25 $\mu$m. The diamond coated part or tool insert can then be used with no polishing or minimal polishing because of the smooth surface resulting from the thin {100} faceted diamond film. The non-{100} orientation film below the surface (e.g. a {110} or {111} faceted film) provides the desired toughness for the wear part.

Figure 4:
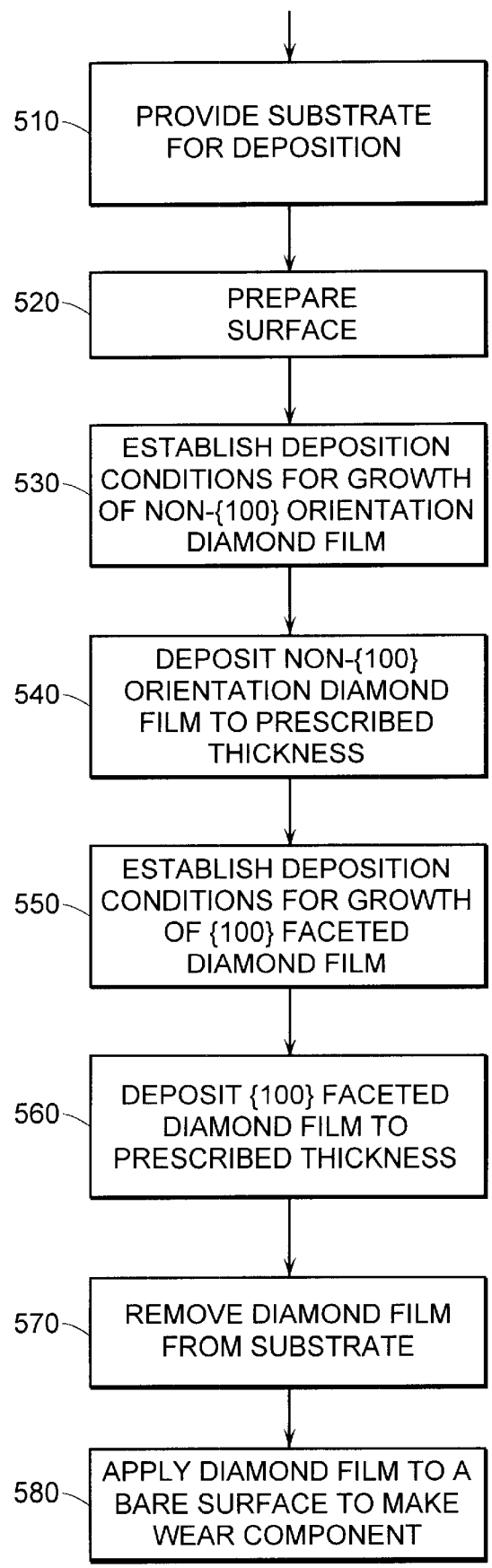
FIG. 4 is an operational flow diagram of a procedure in accordance with another embodiment of the invention for producing a wear component in which a diamond film is made and then attached to a base surface.

FIG. 4 is a flow diagram representative of a procedure in accordance with a further embodiment of the invention in which a diamond film is separately made, and then applied to a base surface to make a wear component. The block 510 represents providing a substrate on which the diamond film is to be deposited. The blocks 520, 530, 540, 550 and 560 correspond to the blocks 420, 430, 440, 450 and 460, respectively, in FIG. 3. Briefly, the block 530 represents establishing the deposition conditions for depositing polycrystalline diamond which does not have a {100} crystallographic orientation, the block 540 represents depositing the non-{100} diamond film to a thickness of at least 0.5 $\mu$m, the block 550 represents establishing deposition conditions for depositing polycrystalline diamond film which is terminated at the free surface by coplanar {100} facets, and the block 560 represents deposition of {100} faceted film to a thickness that is preferably in the range 1 to 10 μm. The block 570 represents removal of the diamond film from the substrate, which will typically occur upon cooling of the substrate. If necessary, the film can then be divided into pieces, such as by laser cutting, and then, for example, attached to the base surface of a cutting tool (as represented by the block 580), such as by brazing.

Figure 5:
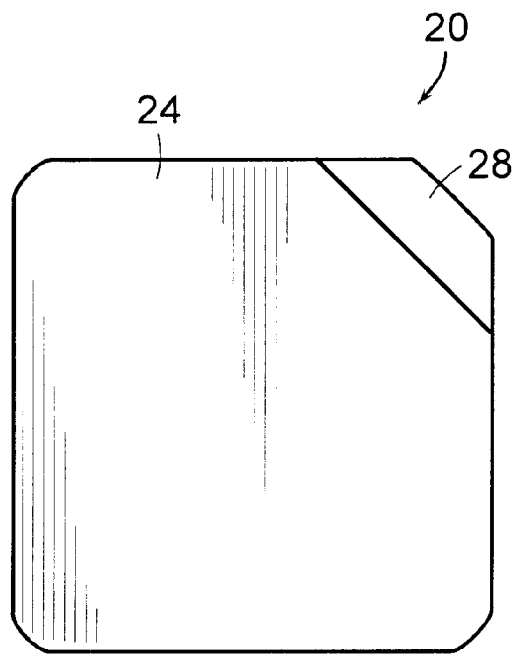
FIG. 5 is a top view of a wear component of a type typically utilized as an insert for a milling machine cutting tool, and which can employ features of the invention.
Figure 6:
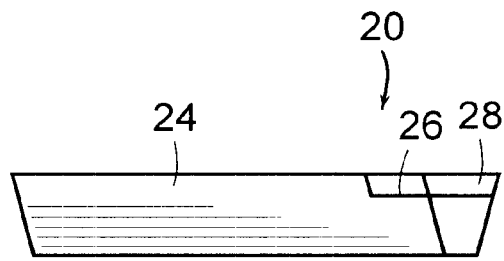
FIG. 6 is a side view of the wear component of FIG. 2.

FIGS. 5 and 6 illustrate an example of a wear component 20 of a type typically utilized as a cutting insert for a milling machine. A tungsten carbide element or body 24 is provided in a generally rectangular shape with a chamfered corner having a depression 26 that receives a piece of diamond 28 that serves as a cutter. As is known in the art, the diamond 28 can be synthetic polycrystalline diamond film. The diamond can be deposited directly on the element 24 or, more typically for diamond thick films, a piece of synthetic diamond film that is mounted, such as by brazing, on the element 24. The diamond film (directly deposited, or formed and mounted) is the advantageously surface textured film hereof.

As noted above various techniques are known for deposition of diamond film having a {100} crystallographic orientation. Some of the techniques are summarized next.

Koidl et al., "Structure And Morphology Of Oriented Diamond Films", Proc. NIRIM Int. Symp. Adv. Mat., Tsukuba (Japan), Mar. 13, 1994, describes growth of {100} orientation diamond films by bias enhanced nucleation using microwave plasma assisted CVD from $CH_4/H_2$ gas mixtures. The deposition temperature and the methane concentration are shown to be selectable to obtain {100} orientation diamond film growth.

U.S. Pat. 5,380,349 discloses a mold having a diamond layer, for molding optical elements. An example is presented in this Patent in which a diamond film is grown by microwave plasma with a {100} orientation, which diamond film was shown to polish faster than {111} or {110} orientation film from a comparative example.

U.S. Pat. 5,240,740 discloses that a microwave plasma can be used for CVD deposition of a {100} orientation faces on diamond like ball particles.

Accordingly, it is seen that, for example, biased-enhanced nucleation and microwave plasma CVD with controlled deposition conditions, have been used to obtain {100} crystallographic orientation diamond film, and these or any other suitable technique can be used herein to obtain the {100} crystallographic orientation diamond film surface texture used on the surface of the wear components of the present invention.

What is claimed is:

1. A method for making a diamond film coated wear part, comprising the steps of:
    providing a wear part;
    depositing a first layer of polycrystalline diamond film on said part with non-{100} crystallographic faceting;
    depositing on the surface of said first layer a second layer of polycrystalline diamond film having {100} crystallographic faceting, said second layer having a thickness sufficient to overgrow the roughness of said surface of said first layer with a continuous film.

2. The method as defined by claim 1, wherein said first and second layers each have a thickness of at least 0.5 microns.

3. The method as defined by claim 2, wherein said second layer is deposited using biased nucleation chemical vapor deposition to obtain diamond film having {100} crystallographic orientation.

4. The method as defined by claim 2, wherein said first layer of diamond film is deposited by chemical vapor deposition using a first set of deposition conditions, and said second layer is deposited by chemical vapor deposition using a second different set of deposition conditions.

5. The method as defined by claim 1, wherein said first layer of diamond film is deposited by chemical vapor deposition using a first set of deposition conditions, and said second layer is deposited by chemical vapor deposition using a second different set of deposition conditions.

6. The method as defined by claim 1, wherein said step of depositing said first layer comprises depositing a layer having {110} or {111} crystallographic faceting.

7. A method of making a wear component, comprising the steps of:
    providing a base surface;
    producing a polycrystalline diamond film structure having a first layer and a second layer on said first layer said first layer having non-{100} crystallographic faceting, and said second layer having {100} crystallographic faceting, said second layer having a thickness sufficient to overgrow the roughness of said surface of said first layer with a continuous film; and
    applying said first layer of said diamond film structure to said base surface.

8. The method as defined by claim 7, wherein said first and second layers each have a thickness of at least 0.5 microns.

9. The method as defined by claim 8, wherein said diamond film structure is applied to said base surface by brazing.

10. The method as defined by claim 9, wherein said second layer is deposited using biased nucleation chemical vapor deposition to obtain diamond film having {100} crystallographic orientation.

11. The method as defined by claim 9, wherein said first layer of diamond film is deposited by chemical vapor deposition using a first set of deposition conditions, and said second layer is deposited by chemical vapor deposition using a second set of deposition conditions.

12. The method as defined by claim 7, wherein said first layer comprises depositing a layer having {110} or {111} crystallographic faceting.

\* \* \* \* \*